United States Patent [19]

Voss

[11] Patent Number: 5,227,998

[45] Date of Patent: Jul. 13, 1993

[54] FAST STATIC RANDOM ACCESS MEMORY

[75] Inventor: Peter H. Voss, La Selva, Calif.

[73] Assignee: U.S. Philips Corp., New York, N.Y.

[21] Appl. No.: 604,730

[22] Filed: Oct. 22, 1990

[30] Foreign Application Priority Data

Oct. 30, 1989 [EP] European Pat. Off. ........ 89202733.5

[51] Int. Cl.$^5$ ............................................. G11C 13/00
[52] U.S. Cl. ................... 365/194; 365/189.05
[58] Field of Search .............. 365/194, 233, 235, 236, 365/238.5, 189.05

[56] References Cited

U.S. PATENT DOCUMENTS 4,567,579  1/1986  Patel et al. ................... 365/189.05
4,586,167  4/1986  Fujishima et al. .............. 365/189.05

Primary Examiner—Joseph A. Popek
Attorney, Agent, or Firm—David Schreiber

[57] ABSTRACT

A static RAM has for each row of cells a bit line and an inverted bit line. For allowing the current data being driven to each cell to be instantaneously stopped and for allowing the (inverted) bit line to go back to a safe non-writing condition two resettable delay chains are provided between a buffering element that has mutually logically inverse data outputs. Each chain has a first sequence of alternating inverter gate series feeding a second sequence of one or more inverters. At the end of a write cycle the gates are reset in parallel, thus shortening the delay to about that of the second sequence only. In this way operating margins are retained.

15 Claims, 6 Drawing Sheets

FAST STATIC RANDOM ACCESS MEMORY

FIELD OF THE INVENTION

The present invention relates to an integrated circuit static random access memory having for each row of cells a bit line and an inverted bit line.

SUMMARY OF THE INVENTION

Among other things, it is an object of the present invention to improve operating speed while retaining operating margins. Now, according to a first aspect of the invention, the object is realized in that it provides an integrated circuit static random access memory comprising control means for controlling either a write mode or a read mode, at least one row of memory cells, first addressing means for selectively addressing one cell in such row, and for any such row:

a bit line and an inverted bit line lengthwise adjoining said row;

input means for receiving a data bit for storage in said one cell;

buffering means fed by said input means and having mutually logically inverse data outputs;

first and second mutually identical delay chains fed by said data outputs, each said delay chain featuring a first sequence of alternating inverter/gate series arrangements, and featuring a second sequence fed by said first sequence, of at least one inverter, said bit line being fed by the second sequence of said first delay chain, and said inverted bit line being fed by the second sequence of said second delay chain, any said gate receiving a reset signal that is inverse to the active input signal applicable to its first signal for at the output of its second sequence generating a deselect state before any succeeding select state.

This feature allows for the current data being driven to the cell to be instantaneously stopped and for allowing the bit lines to go back to a safe non-writing condition. This gives a large improvement in the data hold time margin at so-called hot environment since the local write driver will not be driving when and if an equalization pulse becomes available at the end of a write, thus overall margin can be made higher with respect to Tdh and Tdv (data valid). Typically, a fast end-of-write disable signal is sent to the write driver or pass device to shut down the current write operation.

In particular, two parallel resettable delay lines are provided, one for each of the two logical values (data and data inversed). In an advantageous realization, a cross coupled gate pair is provided for interfacing the two resettable delay lines to the input write buffer. Such gate pair by means of the cross-coupling effect improves the symmetry between the two resettable delay chains.

In particular where in previous solutions often a write/read cycle was mandatory, at present such read cycle part would be superfluous, because now the reset action renders the bit lines safe for then directly allowing a change of either address, or of data, or of both. It is now possible to specify a write cycle where the write enable signal WE is not clocked. In particular, the address transition detected (ATD) signal would provide for pseudo clocking.

Additional advantageous aspects are recited in dependent Claims.

BRIEF DESCRIPTION OF THE DRAWING

The invention will hereinafter be explained further with respect to an exemplary embodiment thereof as shown in the following Figures, wherein.

DESCRIPTION OF A PREFERRED EMBODIMENT

This is a description of a fast addressable RAM, in particular, but not exclusively an asynchronous static RAM of high capacity such as 64 Kbit or up. Various organizations, processing technology and capacities would be feasible.

Figure 1:
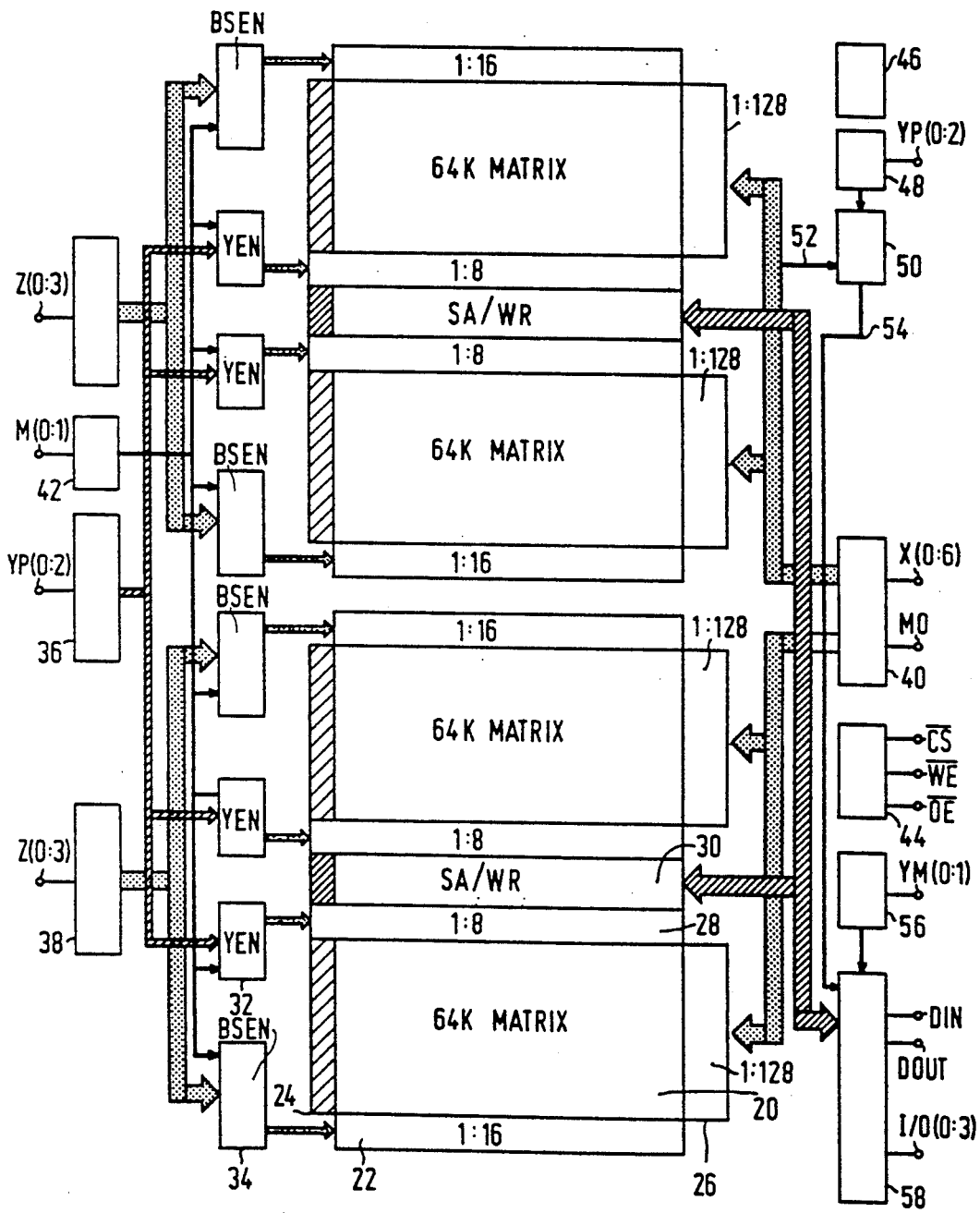
FIG. 1 is a functional block diagram of a 64K×4 memory.

FIG. 1 is a functional block diagram of a 64K×4 memory. In particular shown are a 64K memory cell matrix 20 with block redundancy 24 activatable by fuse blowing as stand-in for defective memory columns, 1 out of 16 block decoder 22, 1 out of 128 row decoder 26, global Y selection one out of eight 28, and 64 local sense amplifiers and write circuits 30. The block has furthermore Y-enable driver 32 feeding element 28 and block selection enable driver 34 feeding block decoder 22. Most of the above elements have been provided fourfold, not renumbered. The blocks local sense amps along with write circuits (30) have been provided only twice.

As further subsystems have been provided YP decoder 36 operating on three address bits, block select predecoders 38 each operating of four identical address bits Z(0:3), row predecoders 40 operating on seven address bits X(0:6) and major half-memory selecting bit MO, block enable driver 42 operating on the block selecting bits M(0,1). Interconnects between decoder 38 and driver 34, between decoder 36 and driver 32, between front end driver 42 and further driver 34 and between predecoder 40 and decoder 26 are as shown.

Control is provided by control decoder 44 that receives inverted values of Chip Select ($\overline{CS}$), write enable ($\overline{WE}$) and Output Enable ($\overline{OE}$). Further subsystems are power regulator 46, test decoder 48 receiving the same address bits as decoder 36 that in test operation double as control bits and test mode setter block 50. The latter receives line 52 and is used for entering into a test mode upon recognition of a predetermined address transition, line 54 controls outputting of certain particular test result signals. The foregoing details are environmental but not distinctive to the present invention, and for brevity, detailing the operation as well as listing various interconnections have been left out. Also, detailing of the memory cells proper, static cells in particular, has not been shown.

More directly related to the invention, there is Y multiplex controller 56 that receives two selection bits and block 58, controlled by block 56, and for test purposes, by block 50, comprising four global sense amplifiers and a same number of global write drivers. This block comprises circuitry for, selectively activatable by manufacturing metallization, realizing either a x1 or a x4 organization. In the first case single input and output bondflaps are useable (DIN, DOUT), in the latter case four parallel I/O interconnections I/O (0:3). Effective use of all connections described necessitates bonding to functional pins of a standard DIL or otherwise geometrically shaped package.

Figure 2:
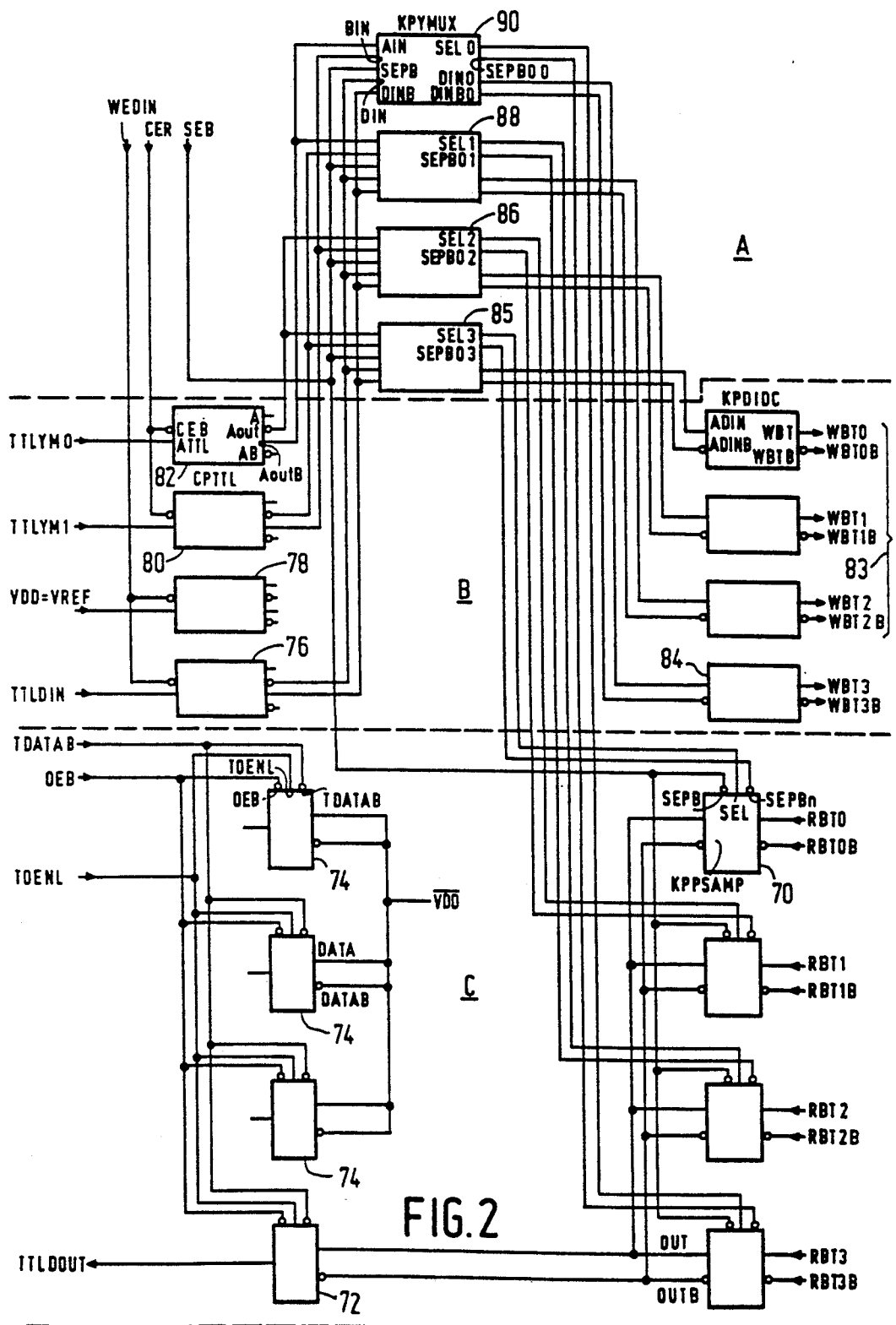
FIG. 2 shows subsystems thereof in the ×1 configuration.

FIG. 2 shows subsystems of the memory of FIG. 1 in a x1 configuration. This means that the data path interconnecting the chip and the outer world is one bit wide. Generally, the circuit contains three parts A, B, C. Part A is a 4 to 1 selector, part B is the write control circuit, part C is the read control circuit.

For a read operation, read bit RBT0 together with its inverse, is connected to p-type sense amplifier 70 and amplified to the two mutually inverse outputs OUT, OUTB thereof. Similar circuitry is provided for further bits RBT 1..3, their outputs being ORed to output buffer 72 that outputs a TTL-level bit DOUT. Three similar output buffers 74 receive VDD and in fact are dummies. Control signals for the buffers are inverted output enable OEB, a test control signal TOENL and test data TDATAB, the latter two not being further explained for brevity.

For a write operation TTL-level data bit TTLDIN arrives at input buffer 76. Similarly buffer 78 receives reference voltage VREF, preferably equal to VDD, and operates as a dummy. Similar buffers 80, 82 (cf. block 56 in FIG. 1) receive address signals YM (0:1) at TTL levels. Block 76 and dummy block 78 receive as control signal the write enable data in WEDIN signal.

Block 80, 82 receive as control signal chip enable (write) CEB signal. At the cell matrix side, block 84 is a resettable data input delay buffer to be specified hereinafter. The use of these delay buffers eliminates the need for an equalization pulse for the address bits YM (0:1). Upon a write access, buffer 84 provides the bit line in question with data bit WBT3 and its inverse WBT3B. Similar buffers 83 have been provided for the three other data bits. For brevity, the interconnection of the circuitry of FIG. 2 to the cell array has not been shown. In fact, addressing of static RAMs and providing uninverted and inverted bit lines, both for reading and for writing, appears standard technology.

Part A of FIG. 2 contains the multiplex (read) and demultiplex (write) control for the sense amplifiers and delay buffers, respectively. The output signals of buffers 80, 82 and their inverse values by means of selective routing to ANDed inputs AIN, BIN of demux controllers 85, 86, 88, 90 provide one-out-of-four predecoding.

For a read operation, p-sense amplifier SEB control signal activates directly all sense amplifiers KPPSAMP 70, while one-out-of-four selection is effected by a respective pair of output select signal pairs SEL (0:3), SEPB (0:3) of controllers 85..90 that also receive signal SEB. The latter signal effectively controls the disabling of the last data bit at any read address as shown by the low-going of trace 128 in FIG. 5 to be discussed hereinafter. On the other hand the select signals SEPB (0:3) control the tail circuitry of the p-sense amplifiers 70 for therein regulating the current of the current mirror arrangement. On the other hand the signals SEL (0:3) have a delay of one gate delay less, so before arrival of signals SEPB (0:3) drives the current in the part to be activated of the CMOS combination. For a write operation, data signal TTLDIN from buffer 76 is selectively forwarded to one of four write delay buffers 86, while disabling the sense amplifiers.

Figure 3:
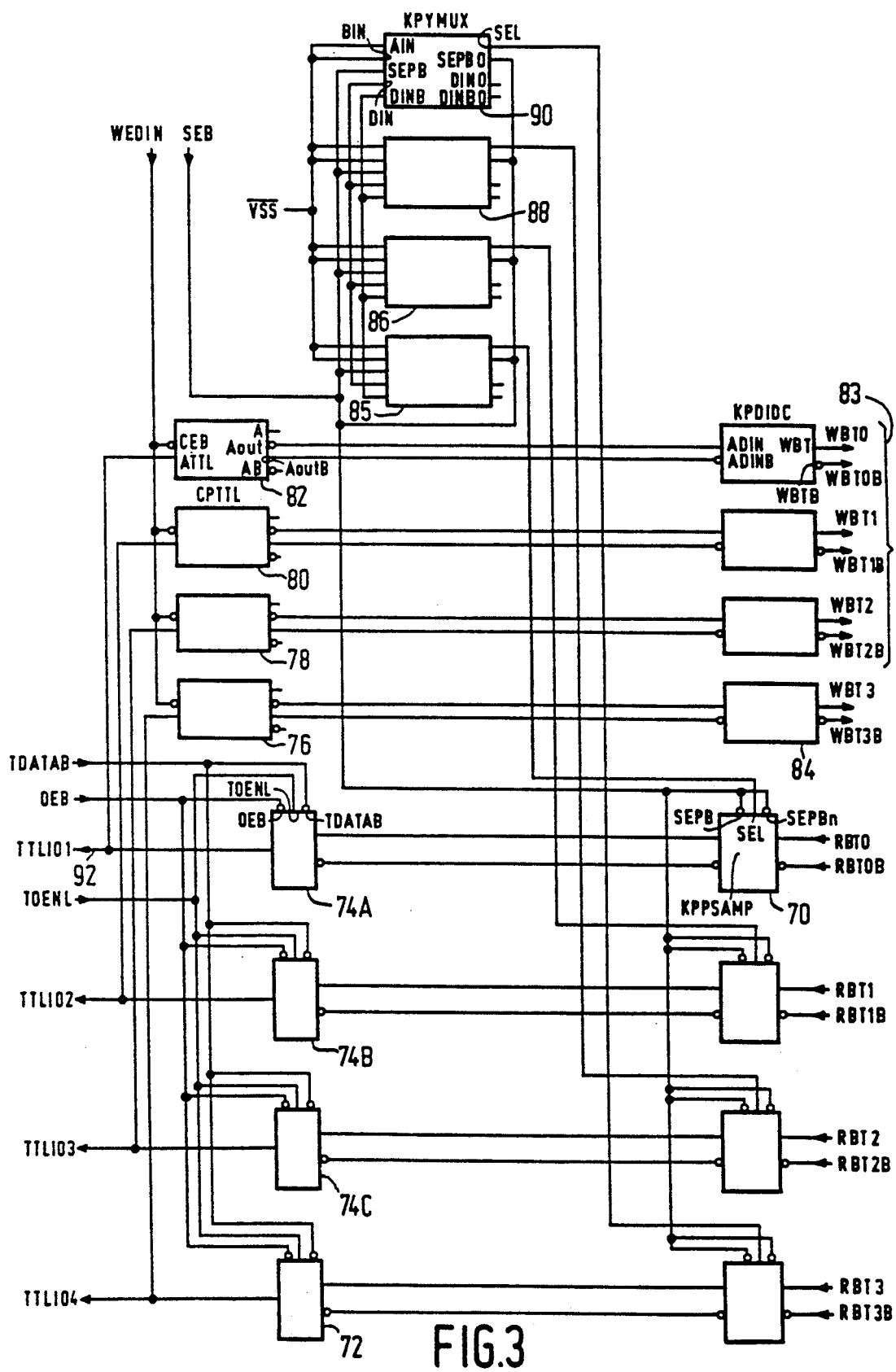
FIG. 3 shows alternative subsystems thereof in the ×4 configuration.

FIG. 3 shows alternatively a set up of the same subsystems in a x4 configuration. In fact, both the circuits and their relative dispositions are identical to FIG. 4, but their metal interconnection pattern has been changed. Manufacturing of the static RAM disclosed required successive application of eleven mask geometries of which two pertained to respective metal interconnection pattern arrangements. Only the last metallization pattern need be changed for going from a x4 to a x1 organization or vice versa, in the technology used. The differencing between FIGS. 2 and 3 only involved change of one of the two metal interconnection pattern masks. Now, for a read operation sense amplifier 70 receives the same input signal and feeds its own buffer 74A for outputting TTL level output signal at bidirectional bondpad TTLI01. Similar provisions exist for other data bits read out RBT (1:3). The sense amplifiers receive each two identical control input signals from input SEB and are separately, but coincidingly controlled by signal SEL from controller blocks 84–90. In fact, the latter by feeding their inputs AIN, BIN by voltage VSS, are rendered continuously inactive. Their SEL output thus continuously activates a associated sense amplifier. Their outputs SEPBO have been interconnected to signal SEB. The reason for the interconnections shown for block 85-90 was not dictated by the intended function, but was facilitated by the design system allowing certain metallization patterns to be easier used than others. Further to the above, output buffers 72, 74A–C are controlled in fully parallel operation by output enable signal OEB. As before, test control signals TOENL, TDATAB have been shown. Blocks 76, 78, 80, 82 are controlled in exactly the same way as in FIG. 2, the difference being that they all are connected to a respective interconnection TTLI (01-04). In contradistinction the FIG. 2, however, all of their outputs feed a respective delay buffer 84, 83.

Figure 4:
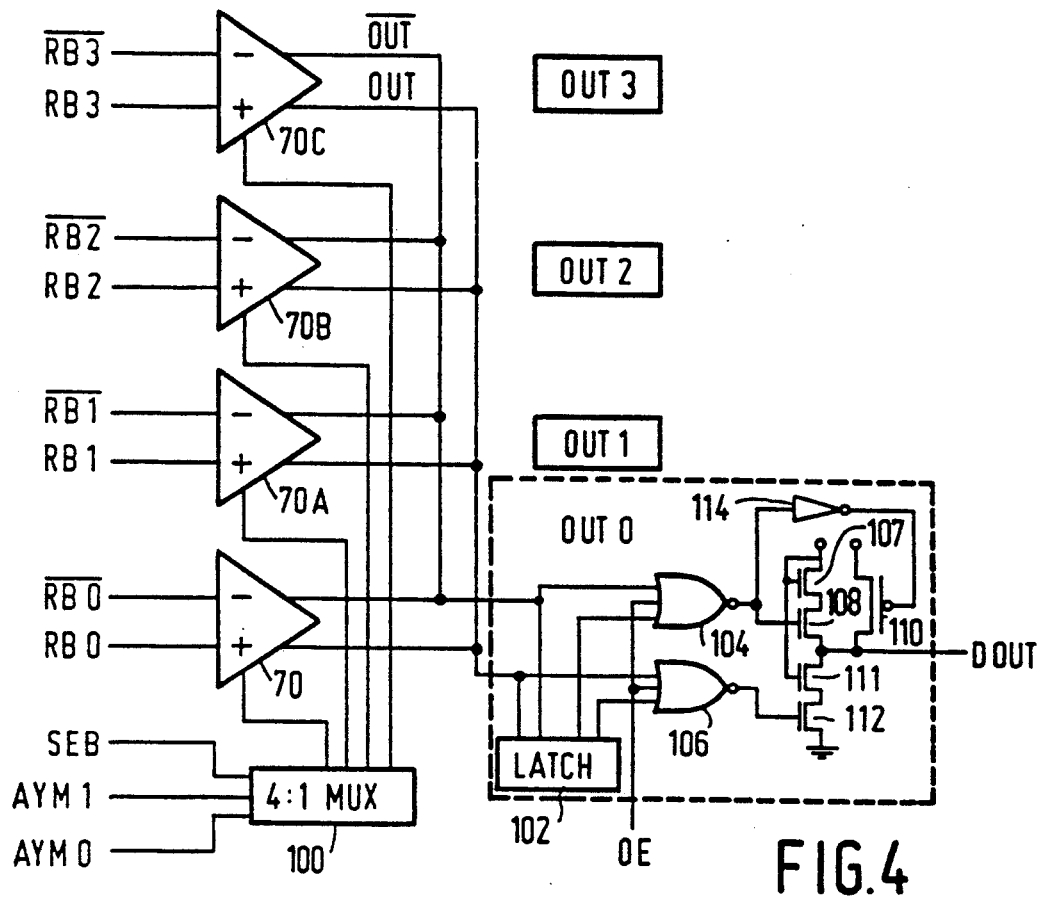
FIG. 4 is a block diagram of a modified output arrangement, for use in the ×1 configuration.

FIG. 4 shows an arrangement, that has been modified according to the invention, in particular for use in the set-up of FIG. 2. In particular, sense amplifiers 70A–70C have been shown in correspondence to element 70 in FIG. 2. Their controlling has been symbolized by block 100 which itself is controlled by signal SEB and the output signals from buffers 80, 82 that each have been shown symbolically as signals AYM0, AYM1. Both the inverted and the noninverted data outputs RB, $\overline{RB}$ from the respective sense amplifiers are fed in one of two wired-OR configurations to associated inputs of latch 102. Outputs of the latch 102 are combined with corresponding multiplexed outputs and the control signal OE, output enable, in two NAND-gates 104, 106. The latter drive an output circuit comprising transistors 108, 110, 112, and inverter 114. One of the series-coupled transistor pair 108, 112 is conducting, while the other one is blocked. Additional series transistors 107, 111 alleviate hot-electron stress problems. In certain technologies they could be superfluous. By means of transistor 110, of opposite conduction type to transistor 108, and driven by an inverted control voltage, switch-over time is lowered further.

An alternative solution would be in that the sense amplifiers would be followed by their respective private latch circuit. In this set-up, the sense amplifiers would be active simultaneously, but the selection signals would successively activate the respective ones of the n (here n=4) latches. Further slightly modified arrangement would be envisageable.

Figure 5:
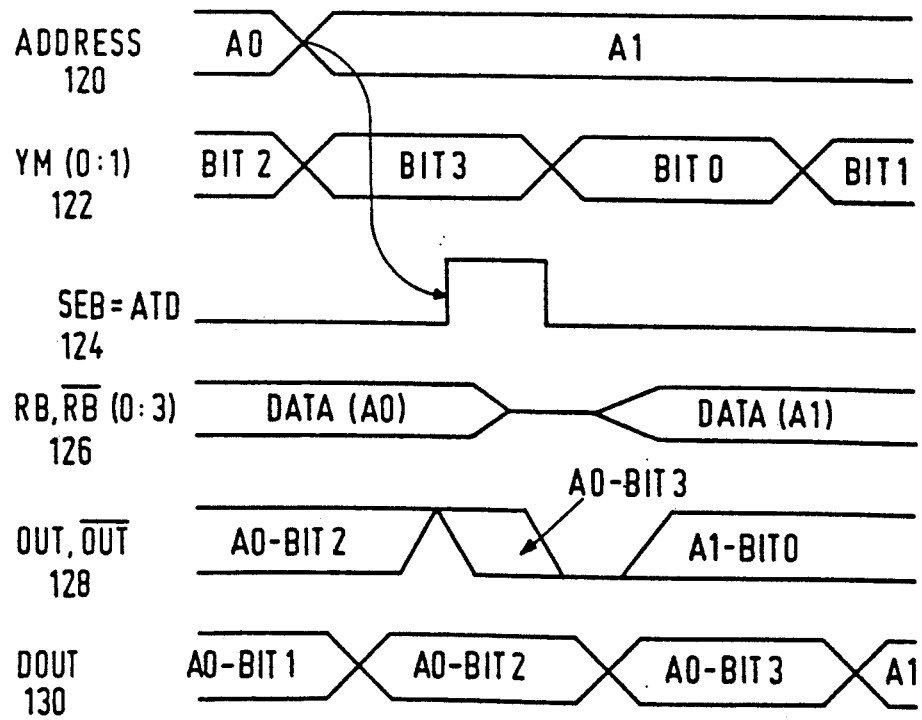
FIG. 5 is a timing diagram of a multi-address page mode.

FIG. 5 is a timing diagram of a multi-address page mode with respect to the arrangement of FIGS. 2, 4. In contradistinction thereto, single-address page or single-address nibble mode consists of applying an address, accessing a plurality of bits in parallel, selecting among those data bits two or more bits in succession, and after selecting of the last data bit, applying a next read address. The selection of those data bits can be effected according to any order of sequence. It is not necessary to select all data bits so accessed. The selection may be uniform relative to successive address locations, but in principle, non-uniformity would also be allowed. Also the number of data bits selected may be non-uniform with respect to successive address locations. The selection may be applied to a single data bit per read address. Now, due to access delay, the time between successive bits during a single-address selection sequence conventionally is substantially shorter than the separation between the last bit selected at a particular address appearing at the memory output and the first bit from the next successive address so appearing. The latter separation's length is a problem which is mitigated for so improving the average access speed of the memory.

In the timing diagram of FIG. 5, trace 120 indicates the memory address that is effectively applied to the memory. First this is address A0 and then, this changes to address A1. Transition slopes have been idealized to standard dimensions. Of such address applied, the combination of X, Z and M address bits selects 32 cells. Of such group of cells, bits YP (0:2) select four cells and selective application of selection signal YM (0:1) would allow for accessing up to four data bits, in FIG. 5 for the complete group of four data bits in read mode according to BIT (0..3). Trace 122 shows the bit selection signals YM (0:1) as applied to element 56 in FIG. 1 or elements 80, 82 in FIG. 2 or element 100 in FIG. 4. The transition of the address on trace 120 coincides with one of the transitions of the selection signals on trace 122, in particular the last one thereof pertaining to the old address A0. As shown, this may be data bit BIT3, but any other bit may apply likewise, independent of the number of data bits actually selected at this old address. The above coincidence diminishes interference effects. The address comprises bits X (0:6), YP (0:2), Z (0:3), M (0:1) in total 16 address bits. Selection of data bit BIT3 is therefore effected coexistently with the next address A1. The multi-address page mode or cross-address nibble mode were made possible by eliminating the need for an equalization signal with respect to the bits YM (0:1). Conventionally the purpose of such equalization pulse is two-fold. In the first place, it provides a wider margin for specifying the write recovery time Twr. In the second place it resets the full-width data path for a faster access. The solution on an electronic level will be described hereinafter with respect to FIGS. 6, 7. Now, because the YM selection has no equalization, even without change in the address it is necessary to read any other (in this case, up to three) data bits present at the inputs of the P-channel amplifiers 70 in FIG. 2. This is symbolically shown in FIG. 5, trace 126, which shows the data bits RB/$\overline{RB}$ at the inputs of those four amplifiers. In principle, the availability of these data bits thus attained could go on for an appreciably long time, in the time length frame (10–100 nsec) of FIG. 5, or even much longer. In consequence, using the control signal SEPB and the decoded selection signals SEL/SEPB (0:3), it is possible to keep three of the four sense amplifiers in a high-output impedance state (so-called three-state) and selectively enable only the fourth one, arbitrarily chosen, of these four sense amplifiers 70. In FIG. 5, trace 128 shows the respective data bits at the output of sense amplifiers 70, somewhat delayed with respect to the selection shown in trace 122. Trace 130 indicates that somewhat more delay occurs before the respective data bits appear at the output of output buffer 72 in FIG. 2. Trace 124 shows a symbolized output signal ATD of an address transition detector, which signal corresponds to the signal SEB discussed earlier. This signal from a detector not shown derives from the changeover between addresses A0, A1 on trace 120. This pulse, on input SEB in FIG. 2, in particular, resets sense amplifiers by way of disabling. In effect, this appreciably shortens the effective duration of data bit BIT3 at trace 128. This unsymmetrical character of the data bit 3 signal is extended and symmetrized again by the output buffering latch. In this way the intended multi-address page mode or cross-address nibble mode are realized. The improvement may be explained in two ways. In the first place, for accessing data among successive address locations, more data could become available in the same time. For example, for reading a four bit nibble, only four bit separations are necessary, compared with about 4+1 according to an earlier technique. On a user synchronization level, the advance is even more clear, in that all bits succeed each other at the enhanced speed. According to earlier technique, this high speed would eventually be interrupted by transition to a next read address. For a user device with a fixed operation sequence, this would have implicated settling to the lower speed. In this view, speed improvement is by a factor of 2.

Figure 6:
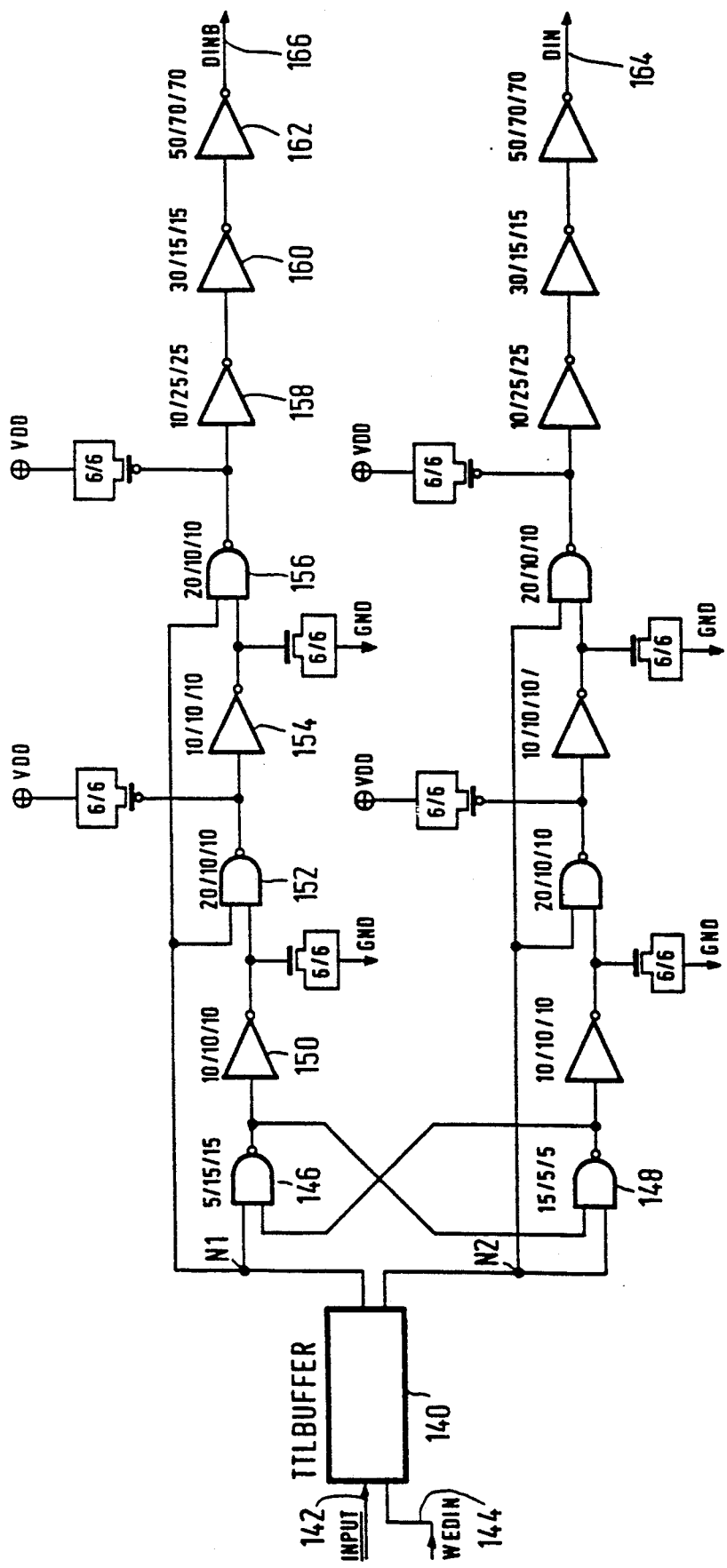
FIG. 6 shows a resettable data input delay buffer.

In the write mode, blocks 86 in FIG. 2 have a resettable data delay chain circuit as shown in FIG. 6. By using this, if a YM selection change occurs (trace 122 in FIG. 5) before the end of a write operation, the next data to be written is delayed by the same amount of time as if an equalization pulse had occurred.

FIG. 6 shows an exemplary resettable data input delay buffer, for use as block 76 in the arrangement of FIG. 2, or, likewise, for use as any of blocks 76, 78, 80, 82 in the arrangement of FIG. 3. As a general organizational background, in a transition from a write cycle to a read cycle, various margin delays must be maintained for correct operation. First, a minimum time is required between input data availability and termination of the write-enable signal (set-up margin) to ensure correct writing. Second, another minimum time (hold time) is required between termination of the write-enable signal and the next change on a data input, in order that the next data is not written at the old address. If a succession of write cycles occurs in sequence, this hold time need not be present. However, in case of successive write cycles, a problem occurs in that the bit lines must be loaded to an appropriate potential, which, inter alia, implies loading the lateral capacity with respect to adjacent bit line or lines. Especially if two successive write operations imply to opposite bit values, with respect to a particular data line, the necessary Coulomb load may be high. If however, two successive write actions were always separated by a precharge, the worst Coulomb loading is halved, which means either halving of the current strength, or halving of the loading time, or some trade-off in between. Now, standard practice requires the write enable control signal to be activated before any address transfer. However, according to the use of the circuit to be described hereinafter, a kind of dummy writing operation is performed: in multiplexed input paths a precharged overlap allows multiplexing changes of address to be effected without necessity of using the address transition detection signal. In consequence, now the address or the data applied may change without a need for de-activation of the write-enable signal.

Now, in particular, FIG. 6 shows a more detailed circuit to be used in each of blocks 86, in each respective data input channel. Buffering element 140 corresponds to block 76 in FIG. 2, and therefore, electronically, also to blocks 78, 80, 82. It receives data input signals INPUT that may, but not necessarily need to have TTL values, on input 142 and the control signal WEDIN on input 144. The latter signal is a functionally ANDed signal of the write-enable buffer signal and the chip enable control signal. For brevity the generation thereof has not been shown. The nature of block 140 may be conventional, and in consequence is not detailed further. Mutually inverse output data signals are outputted to each of two resettable data delay chains. Each of these chains has eight elements that are cascoded inverters, or cascoded two-input NAND-gates, as respectively shown. The cascoding is particular to the manufacturing process used; it alleviates hot-electron stress problems. In other technology or process such cascoding would not be necessary. Now, in the particular process used, for each of the elements used, the lengths of the p-transistors are 1 micron, for n transistors, 0.9 micron. For each inverter, the widths of top, cascode, and bottom transistors have been shown in sequence and expressed in microns. In a NAND-gate, of course, each input signal has its own top and bottom transistors, respectively, the whole realization being in C-MOS. Again, in the process used, a cascode provision has been found advisable. Furthermore, various square-shaped MOS-transistors have been used, dimensioned, as shown, in microns, as respective implementations of various delay element parts.

By itself, a data-in delay buffer may be incorporated in static RAMs to provide an adequate relationship between the two timing specifications for Tdh (data hold) at cold=0° C. ambient temperature where TTL voltage is 5.5 Volts and Tdv (data valid) at high operating temperature (70° C.) where TTL voltage has generally decreased to 4.5 Volts. As an alternative, it has been proposed to execute the buffer with an inverter delay that may give the necessary margin for Tdh at cold environment. This delay then provides the timing margin needed for a specification that stipulates zero ns, but if the delay becomes too long it would start infringing on the other write specification for Tdv at hot environment. The combination of the two so specified time intervals becomes harder to achieve as the access time for fast static RAM goes below 20 ns, since all timing intervals are more or less proportional. The solution was provided in the delay buffer shown. Moreover, by providing two paths for each delay chain instead of only a single path, the delay path can be made such that the old data is released before the new data becomes available. This allows for the current data being driven to cell to momentarily stop and allow the bit lines to go back to a safe non-writing condition. This gives a large improvement in Tdh since the local write driver will not be driving when and if an equalization pulse becomes available at the end of a write, thus more overall margin can be realized both with respect to Tdh and with respect to Tdv. Typically, a fast end-of-write disable signal is sent to the write driver or pass device to shut down the current write operation.

In the circuit, nodes N1 and N2 shown are driven out of a buffer 140 which provides 0's when the chip is not in a write mode. At no time, does the data delay chain produce simultaneously a high state (1) or active state on both outputs DIN and DINB 164, 166. This feature is accomplished by:

a) a cross-coupled NAND-gate (146, 148) which is used to insure a break before make (a modified implementation by cross-coupled NOR-gates would appear obvious)

b) and that the old active data is brought to low state (0) before the new becomes active (1).

On a detailed circuitry level, cross coupled NAND's 146, 148 constitute a symmetrizing facility; an even-number inverter/NAND sequence 150/152, 154/156 provides the essential delay by virtue of MOS capacitors to both VDD and ground in alternating arrangement. Two sequences of further inverters in geometrically ascending dimensions constitute output buffers 158, 160, 162. It should be noted, that the relevant sequence in this representation is bottom, top, bottom transistor, so 25, 30, 70 microns, respectively. Similarly, the other relevant sequence be top, bottom, top transistor, so 10, 15, 50 microns, respectively. Addition/deletion of a serial inverter pair would naturally increase/decrease the associated time delay. Addition/deletion of a single inverter in each of the parallel chains would invert the signs, and, in principle, would change-over the DIN/DINB signals. Moreover, appropriate measures should be taken that the signals DIN/DINB would never be 1 simultaneously, for example by rearrangement of the cross-coupled gate pair and directly following inverters. On the other hand, the chains could likewise be lengthened by a pair of serial parts such as 154+156.

Figure 7:
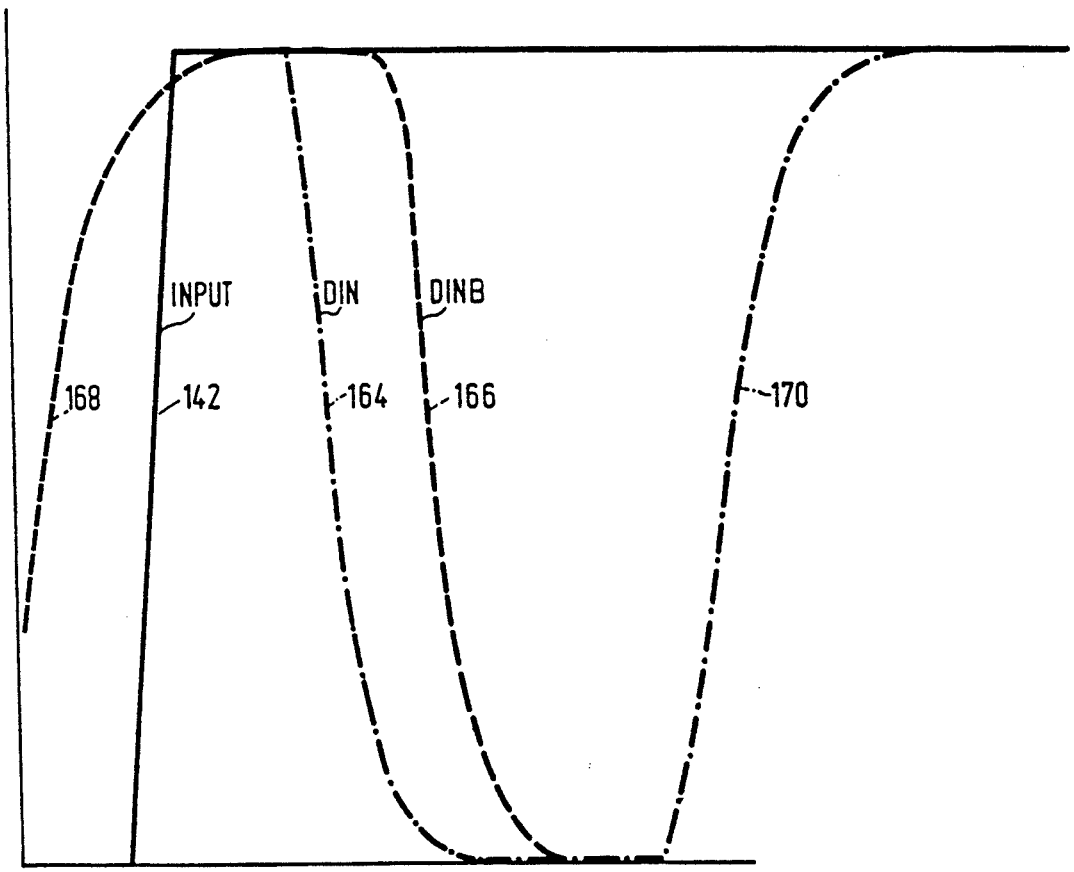
FIG. 7 shows timing of the data input delay buffer.

It can be seen in the C.A.D.-simulation drawing in FIG. 7, that as the input data of the chip changes, (142) the preceding data (164, 166) will first go to a low state which in turn disactivates the local write drivers in the local read/write blocks. The drawing shows the relative delay between DIN and DINB becoming disactive, due to asymmetrical delay of N1 and N2 coming out of the address buffer, although the new data (0 to 1) is highly symmetrical (170) to input switching. The delay chains themselves are built by placing NAND gates in the chain to give a quick deselect low state on either DIN or DINB and using poly gate capacitors to $V_{DD}$ and $G_{ND}$ for good process independent delays. Far at left, the DIN/DINB (168) of the preceding cycle has been shown. The Figure is a composite, because in practice, one of the signals DIN/DINB remains low throughout the operation. The Figure shows that always both DIN/DINB become low, before one of the two may get high (again).

I claim:

1. An integrated circuit static random access memory comprising control means for controlling at least one of a write mode and a read mode, at least one row of memory cells, first addressing means for selectively addressing one cell in said row, and for each of said rows:

a bit line and an inverted bit line lengthwise adjoining said row;

input means for receiving a data bit for storage in said one cell;

buffering means for holding said data bit and having mutually logically inverse data outputs;

first and second mutually identical delay chains for receiving said data outputs, each of said delay chains having an output in one of a select state and a deselect state, each of said delay chains comprising a first sequence of delay elements, said first sequence including at least one inverter and one gate in series and a second sequence of delay elements, said second sequence receiving an output of said first sequence and including at least one inverter, said bit line receiving an output of said second sequence of said first delay chain, and said inverted bit line receiving an output of said second sequence of said second delay chain, and said one gate receiving a reset signal that is inverse to an active input signal for generating a deselect state before any succeeding select state at the output of said second sequence.

2. An integrated circuit as claimed in claim 1, wherein said reset signals are directly generated by the data outputs from said buffering means.

3. An integrated circuit memory as claimed in claim 2, further comprising between the outputs of said buffering means and the inputs of said first and second delay chains a cross-coupled gate pair.

4. An integrated circuit as claimed in claim 3, wherein the inventors of said second sequence include a plurality of transistors having a combined width which increases monotonously from the input of said delay chain to the output of said delay chain.

5. An integrated circuit as claimed in claim 4, wherein said inverter of said first sequence has a MOS-capacitor coupled between an output of said inverter of said first sequence and ground.

6. An integrated circuit as claimed in claim 5, wherein said first sequence is provided with an intermediate MOS capacitor, said capacitor coupled at the junction between said inverter and said gate and a predetermined voltage.

7. An integrated circuit as claimed in claim 6, wherein the data inputs of said buffering means have a polarity which corresponds to a polarity of said output of said second sequence of said first and second delay chains so that the output of said first and second delay chains have opposite polarity.

8. An integrated circuit as claimed in claim 2, wherein the inverter of said second sequence includes a plurality of transistors having a combined width measured in microns which increases monotonously from the input of said delay chain to the output of said delay chain.

9. An integrated circuit as claimed in claim 2, wherein said inverter of said first sequence has a MOS-capacitor coupled between an output of said inverter of said first sequence and ground.

10. An integrated circuit as claimed in claim 2, wherein said first sequence is provided with an intermediate MOS capacitor coupled at a junction between said inverter of said first sequence and said gate and a predetermined voltage.

11. An integrated circuit as claimed in claim 2, wherein the data inputs of said buffering means have a polarity which corresponds to a polarity of said output of said second sequence of said first and second delay chains so that the output of said first and second delay chains have opposite polarity.

12. An integrated circuit as claimed in claim 1, wherein at least one inverter of said second sequence includes a plurality of transistors, having a combined width measured in microns which increases monotonously from the input of said delay chain to the output of said delay chain.

13. An integrated circuit as claimed in claim 1, wherein said inverter of said first sequence has a MOS-capacitor coupled between an output of said inverter and a ground of said inverter.

14. An integrated circuit as claimed in claim 1, wherein said first sequence is provided with an intermediate MOS capacitor coupled between a predetermined supply voltage and a junction between said one inverter and said one gate and one of a predetermined voltage.

15. An integrated circuit as claimed in claim 1, wherein the data inputs of said buffering means have a polarity which corresponds to a polarity of said output of said second sequence of said first and second delay chains so that the output of said first and second delay chains have opposite polarity.

* * * * *